SOLID STATE ACOUSTIC IMAGE CONVERTER

Filed Nov. 29, 1966 2 Sheets-Sheet 1

INVENTORS.
PHILIP S. GREEN
ALVIN E. BROWN
BY George C. Sullivan
Agent

*INVENTORS.*
PHILIP S. GREEN
ALVIN E. BROWN
BY George C. Sullivan
Agent

United States Patent Office 3,475,551
Patented Oct. 28, 1969

3,475,551
SOLID STATE ACOUSTIC IMAGE CONVERTER
Philip S. Green, Redwood City, and Alvin E. Brown, Cupertino, Calif., assignors to Lockheed Aircraft Corporation, Burbank, Calif.
Filed Nov. 29, 1966, Ser. No. 597,780
Int. Cl. H04n 5/38
U.S. Cl. 178—7.2 12 Claims

ABSTRACT OF THE DISCLOSURE

A solid state acoustic image converter comprises a thin piezoelectric plate adapted to receive acoustic waves and convert them into an electric potential. Various switches and photoconductive and photoresistive devices are connected to the electric side of the plate. Scanning techniques are utilized to sequentially conduct the electric currents from elemental regions of the plate. High current leakage from the plate surface is overcome by modulating currents from the conducting region only, thus permitting detection of a modulated signal free from leakage currents.

Figure 1:
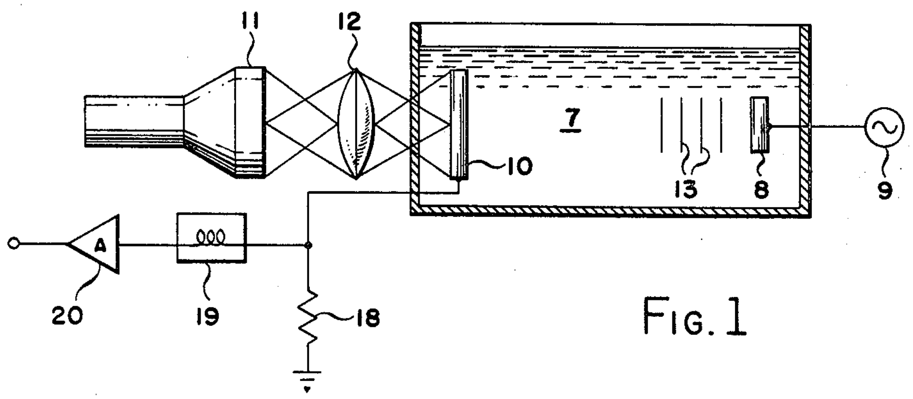

The present invention relates to devices employing piezoelectric materials for the conversion of acoustic images to electrical signals, from which visual images may be formed, and in particular, to solid state acoustic image inverters.

The state of the art of acoustic image conversion methods generally fall into three categories; (1) those employing mechanical scanning, (2) those employing electronic scanning, and (3) those employing switch selection.

In variations employing a mechanical scanning means, either a small transducer is moved with respect to the acoustic field, or a capacitive or conductive electrical probe is mechanically scanned past a fixed, piezoelectric plate. These mechanical methods of scanning are usually too slow for most present day usage since the slow scanning rate reduces frame frequency. Further, the size and weight of mechanical scanning apparatus usually makes them unwieldy and thereby reduces their usefulness in field operation.

The most common variation of an electronic acoustic image converter employs scanned electron beams. The electron beams impinge upon the illuminated side of a piezoelectric plate and cause, depending upon their energy, either an emission of secondary electrons from the surface, or a flow of current therefrom, both of which are proportional to the acoustically induced electrical potential at that point. In one embodiment of a electronic type of converter, a scanning light beam impinging upon a photoemissive surface applied to the back of a piezoelectric plate generates photoelectrons in proportion to the acoustic pressure at that point on the front of the plate. The size (and hence resolution) of these vacuum-tube devices is limited because of the frailty of the thin piezoelectric plate. The converters dependent upon the modulation of secondary or photoelectrons are limited in sensitivity by the modulation threshold of the emitting material.

Sequential selection from a matrix of piezoelectric elements (or from a matrix of electrodes on a single piezoelectric plate) may be accomplished with mechanical or electric switches. The principle disadvantage of this method is that the emittance of the "off" switches is generally high enough so that the total leakage signal from all of the "off" elements may exceed the signal from the one element being interrogated.

It is the object of the present invention to provide a solid state acoustic image converter that overcomes the difficulties found in utilization of present acoustic image converters.

Another object of the present invention is to provide improved sensitivity of operation of the solid state acoustic image converter.

The main feature of the present invention is to provide a solid state acoustic image converter which permits the application of one or more modulation techniques in order to suppress the leakage signal from the image-plate elements which are switched off.

Another feature of the present invention is in the use of capacitance coupled photodiodes as non-linear elements when illuminated to produce only cross modulation products of the applied frequencies.

Another feature of the present invention is the depositing of solid state switches on the piezoelectric element.

Another feature of the present invention is that it may be made almost arbitrarily large due to the fact that no vacuum is required for its operation, thereby providing improved resolution.

In all of the embodiments which will be described and illustrated, the switching from element to element of a piezoelectric plate is effected by either light beam scanning of a photoconductive surface or scanning of a matrix of photodiodes which are affixed or electrically connected thereto, or by row-column selection of a matrix of semiconductor gates deposited upon or electrically connected to the piezoelectric plate. It is noted that other means may be employed to activate a system of solid state switches in a manner affecting in sequence each elemental area of the piezoelectric surface.

Figure 2:
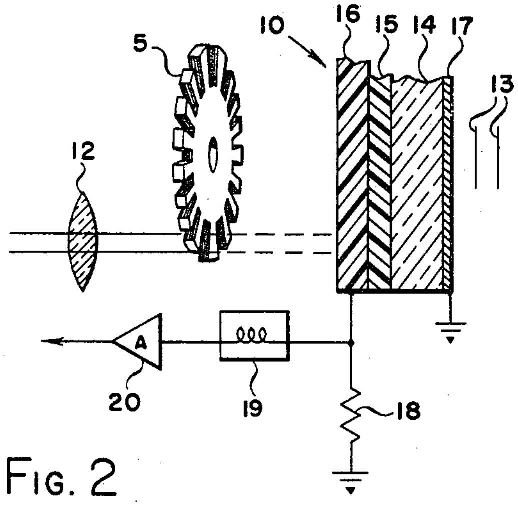
Figure 3:
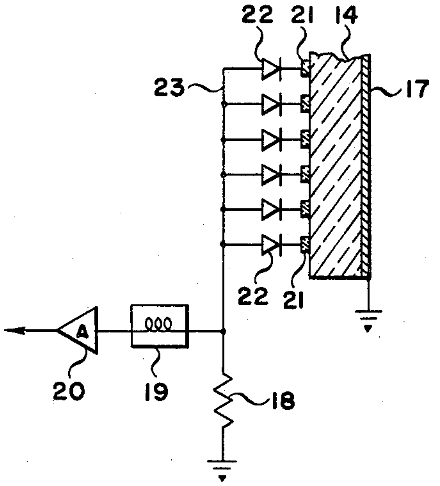
Figure 4:
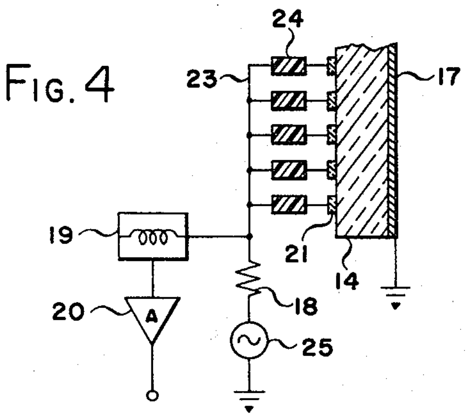
Figure 5:
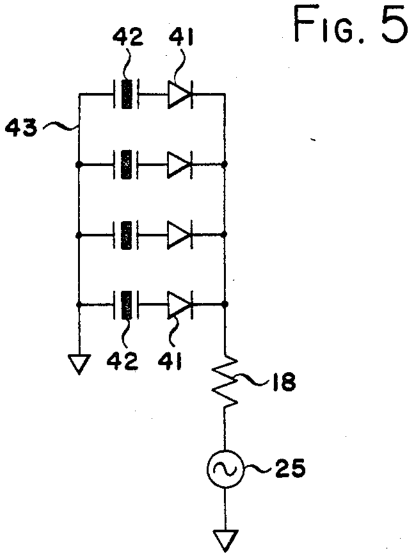
Figure 5A:
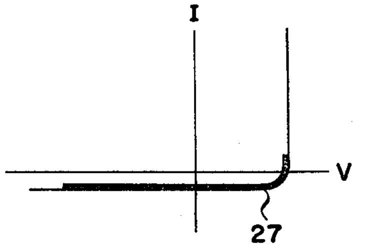
Figure 5B:
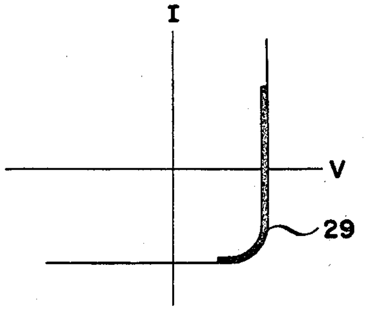
Figure 6:
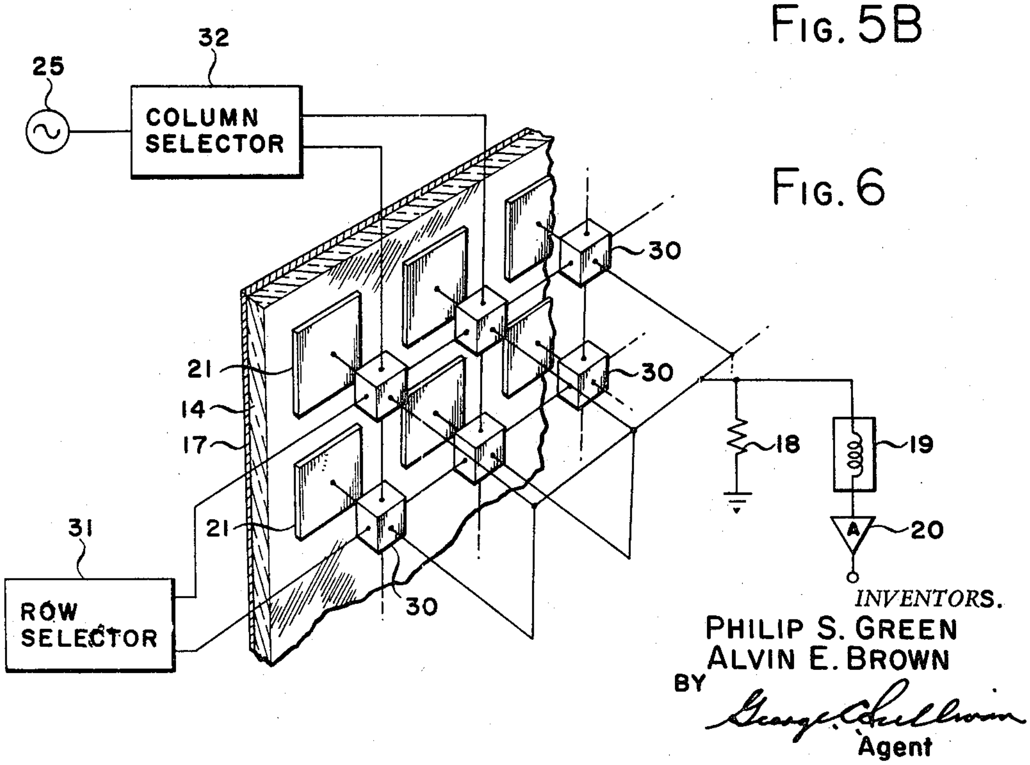

The above objects and features and other objects and features of the present invention will become apparent to those skilled in the art of acoustic imaging after a careful perusal of the following specification and drawings of which:

FIGURE 1 represents a diagrammatical cross-sectional view of a light beam scanned acoustic image converter system, FIGURE 2 is a partial exploded sectional view of the acoustic image converter of FIGURE 1, FIGURES 3 and 4 are partially exploded sectional views of alternate embodiments of acoustic image converters, FIGURE 5 is another partially exploded sectional view of an acoustic image converter employing capacitively-coupled photosensitive semiconductor diodes, FIGURES 5A and 5B illustrate the non-linear characteristic curve of the photosensitive semiconductor diodes of FIGURE 5, and FIGURE 6 illustrates an exploded fragmented view of an embodiment of an acoustic image converter employing a row-column matrix selection mechanism.

Referring now to the drawings, a light beam scanned acoustic image converter system of FIGURE 1 comprises an acoustic image converter device 10 scanned by the light beam of an electron beam scanner 11, for example, a conventional kinescope. A convenient lens 12 is positioned between the face of scanner 11 and the illuminated side of converter 10. The purpose of lens 12 is to focus the light spot from the kinescope onto the surface of converter 10. Acoustic waves 13 are generated and transmitted by an electrical oscillator 9 and electro-acoustic transducer 8. A medium 7, for example water, supports the acoustic waves 13 traveling from transducer 8 to converter 10. It is noted that many other types of light beam scanning devices could be employed and the kinescope-lens method is shown as being merely exemplary.

Image converter 10, as seen in FIGURE 2, comprises a thin piezoelectric plate 14 coated on its illuminated side with a thin layer of photoconductive material 15. The thin layer of photoconductive material 15 is in turn coated with a transparent conductive coating 16. The isonified side of plate 14 is provided with a common electrode 17, a thin silver coating for example. Transparent conductive coating 16 is electrically connected to a resistor 18 and to a tuned filter 19 which in turn is connected to a video amplifier 20.

In operation, kinescope electron beam scanner 11 generates and lens 12 directs a scanning light spot which illuminates in sequence each point of the photoconductor 15. Lens 12 is positioned such that the light beam impinges upon the surface of photoconductor 15. As is well known, the incident acoustic wave 13 on the insonified side of plate 14 causes a voltage proportional to the amplitude of the wave to appear on the illuminated side thereof. Wherever the light beam from kinescope 11 impinges, photoconductor 15 permits the acoustically induced voltage at that point on piezoelectric plate 14 to be conducted through to the transparent electrode 16 and develop a video signal across the load resistor 18. The video signal is then filtered if necessary, amplified and is suitable for visual presentation.

Since the photoconductive layer 15 must be very thin to allow the light to penetrate its surface to change its resistivity, its capacitance is relatively high. Therefore, especially for high acoustic frequencies, the electric current associated with the illuminated conducting region of the photoconductor may be exceeded by the total leakage current from the remainder thereof. To overcome this low selectivity, it is possible to modulate the light beam from scanner 11 by modulating its control grid or cathode potential if it is a kinescope or by inserting a light chopper or shutter device 5 to vary the intensity of the light spot impinging on photoconductor 15 at a frequency $F_L$. This frequency may be of the order of magnitude of the acoustic frequency $F_A$ of acoustic wave 13 incident onto the insonified side piezoelectric plate 14. The effect of the varying light intensity will cause the resistance of the photoconductive material at the point being illuminated to vary at the frequency $F_L$. Thus, the signal being conducted from the illuminated spot and only from that spot will be modulated by $F_L$. The output signal from the photoconductive surface can be filtered by bandpass filter 19, tuned to a center frequency of $F_B$ equal to either $F_L-F_U$ or $F_L+F_U$. The resulting beat frequency $F_B$ will have an amplitude directly proportional to the amplitude of the acoustic field at the illuminated spot on photoconductive plate 15. This beat frequency signal will be free of all leakage currents generated at other spots on the plate since they will have no components at the beat frequency $F_B$. After amplification of the signal at the frequency by video amplifier 20, the signal is then suitable for a visual display.

FIGURE 3 depicts an alternate embodiment of the acoustic imaging converter 10. The isonified side of piezoelectric plate 14 is identical to that described in FIGURE 2. The illuminated side of piezoelectric plate 14 is provided with a matrix of electrodes 21 attached thereto. Each electrode 21 is connected to a semiconductor photodiode 22 and each diode 22 is connected in turn to a common electrode 23. The scanner is provided with a light chopper or some other device to modulate the scanning light as in FIGURE 2. In this embodiment diodes 22 may be remotely located from the piezoelectric plate 14. Diodes 22 could be arranged in any configuration, for example a ring, in order to facilitate the light beam scanning.

The embodiment shown in FIGURE 4 depicts an alternate modulation technique from the light chopper used to modulate those of FIGURES 2 and 3. A matrix of electrodes 21 is attached to the illuminated side of piezoelectric plate 14, each being connected to a common conductor 23 which in turn is connected to load resistor 18. An electrical oscillator 25 is provided between ground and load resistor 18 to provide an oscillating current to photoconductors 24. Each of the photoconductive elements 24 is of a type which exhibit electrical non-linearity only when illuminated. The photoconductive elements 24 when illuminated by the scanning light will produce cross modulation products of the two signals being impressed thereon. Therefore, when the signal from electrical oscillator 25 is fed to the circuit containing the illuminated and now electrically non-linear element 24, cross-modulation products at frequencies which are the sum and difference of the acoustic and locally generated signals are produced. Currents flowing through the load resistor 18 from the unilluminated elements are primarily at the acoustic and local oscillator frequencies only and can be filtered out by tuned filter 19.

Non-linearity in a photoconductor can be achieved, for example, by electroding the photoconductor with a material having a work function higher than that of the photoconductor, or by employing the photodiode configuration of FIGURE 5. A matrix of photodiodes 41 are connected to a frequency generator 25 through resistor 18'. Each photodiode 41 is connected to a piezoelectric element 42. A common conductor 43 interconnects all of the elements 42. That photodiodes, when connected to piezoelectric elements have the required properties, is illustrated in the curves shown in FIGURES 5A and 5B. FIGURE 5A shows the characteristic curve of an unilluminated diode. The signal from local oscillator 25 will cause the diode current, which must have a zero average owing to the presence of the capacitive piezoelectric material, to oscillate over the darkened region 27 of the curve in 5A. In this state the photodiode is relatively nonconductive and linear. Under illumination from the scanning source, the characteristic curve of FIGURE 5B is displaced negatively in current. However, the average current must still be zero due to the presence of the capacitive material. Thus, the operating range, the darkened region 29, due to the local oscillator signal is located in the relatively conductive, highly non-linear region, thereby generating modulation products between the local oscillator signal and the acoustically induced signal.

In FIGURE 6 there is illustrated another embodiment of the present invention. A matrix of electrically activated semiconductor gates 30, each connected to an elemental electrode 21, are deposited on piezoelectric plate 14. The semiconductor gates 30 are connected to a common load resistor 18. An electrical switching system comprising a row selector switch 31 connected to each row of gates 30 and column selector switch 32 connected to each column of gates 30 is provided. Row selector switching system 31 disables all of the rows of gates 30 but one at a given instant and column selector gating system 32 disables all but one column at any given instant. Local oscillator 25 is connected to column selector 32 so that the selected column is modulated at the local oscillator frequency. This arrangement provides that currents will flow through the load resistor at frequencies which are the sum and difference of the local oscillator frequency and the acoustically induced frequency. These currents are proportional to the acoustic pressure at the selected element only, and can be separated from the leakage signals by filter 19. A further suppression of leakage signals can be effected by introducing an additional local oscillator at a different frequency, that is operated in conjunction with the row selection system 31. Here, the desired results would be found at frequencies which are the sums and differences of the three primary frequencies involved. After filtering out the undesired frequencies, the signal is amplified for presentation on a video display.

The present invention permits the use of imperfect switching devices such as transistors and photodiodes as means of selecting one signal from perhaps tens of thouands of others at the same frequency. Such performance arises from the use of either a locally generated signal in conjunction with the non-linear properties of the switching devices or from the use of rapidly interrupted "turn-on" signal, for example, chopped light beam or modulation row or column selection.

Various modifications of the present invention may of course be made by those skilled in the art without departing from the spirit of the invention as defined in the following claims:

We claim:

1. A device for converting acoustic images into electrical signals comprising: a piezoelectric plate adapted to receive an acoustic wave on an insonified surface thereof and produce an electric potential on a second surface thereof; said piezoelectric plate provided with an electrically conductive coating on said insonified surface and a photoconductive coating on said second surface thereof; light scanning means for illuminating in sequence each incremental area of the surface of said photoconductive surface, means for modulating the light beam illuminating the surface of said photoconductive surface and means connected to said photoconductive surface to develop said electric potential into a video signal.

2. The device according to claim 1 further including a transparent conductive coating provided on said photoconductive coating, a load resistor connected to said transparent conductive coating to develop said electric potential into a video signal, a tuned filter connected between said resistor and said transparent conductive coating, said tuned filter being tuned to a beat frequency of said acoustic wave and said light interrupting means whereby the amplitude of the said beat signal will be directly proportional to the amplitude of the acoustic wave at the illuminated area on the said photoconductive coating.

3. A device for converting acoustical images into electrical signals comprising: a piezoelectric plate adapted to receive an acoustic wave on an insonified surface thereof and produce an electric potential on a second surface thereof; said piezoelectric plate provided with an electrically conductive coating on the insonified surface thereof; a matrix of electrodes deposited on the second surface of said piezoelectric plate, an array of semiconductor photodiodes, means whereby each of said semiconductor photodiodes is connected to an electrode, scanning means for scanning in sequence each photodiode with light and means connected to said array of photodiodes to develop said electric potential into a video signal.

4. The device according to claim 3 wherein said array of photodiodes is remotely located from said matrix of electrodes deposited on the second surface of said piezoelectric plate.

5. The device according to claim 4 wherein said array of photodiodes is positioned to form a ring of photodiodes and said scanning means includes a light element mounted on a rotary arm; means for rotating said rotary arm thereby scanning said array of photodiodes in sequence.

6. A device for converting acoustic images into electric signals comprising: a piezoelectric plate adapted to receive an acoustic wave on an insonified surface thereof and to produce an electric potential on a second surface thereof; said piezoelectric plate provided with an electrically conductive coating on the insonified surface; a matrix of photoconductive elements, a matrix of electrodes deposited on the second surface of said piezoelectric plate means whereby each of said photoconductive element is connected to an electrode, means whereby said photoconductive elements exhibit electrical non-linearity only when illuminated; light scanning means for illuminating in sequence each photoconductive element of said matrix of photoconductive elements; means for applying a modulating signal to said matrix of photoconductive elements whereby each photoconductive element as it is illuminated will produce cross modulation products of the frequencies of said acoustic wave and said modulating signal, and means connected to said photoconductive elements to develop one of the cross modulation products into a video signal.

7. A device for converting acoustic images into electric signals comprising: a piezoelectric plate adapted to receive an acoustic wave on an insonified surface thereof and produce an electric potential on a second surface thereof; means whereby said piezoelectric plate is provided with an electrically conductive coating on the insonified surface thereof; a matrix of electrodes deposited on the second surface of said piezoelectric plate; a matrix of electrically activated gates, each connected to an electrode, electrical switching means for opening each electrically activated gate in sequence thereby rendering said gate electrically conductive; means for producing and applying a modulating signal for modulating the conductivity of each gate when open and means connected to said matrix of gates to develop said electrical potential into a video signal.

8. The device according to claim 7 whereby each of said electrically activated gates is deposited on one of said electrodes.

9. The device according to claim 7 whereby said electrically activated gates are located at a remote location from said piezoelectric plate.

10. The device according to claim 7 whereby said matrix of gates is aligned in columns and rows; means whereby said switching means includes a row selector and a column selector, means whereby said row selector and column selector cooperate to render conductive only one gate at a time.

11. The device according to claim 10 whereby said means for applying a modulating signal to said gates includes a modulating signal generator, said signal generator connecting to said gates through one of said selectors, means for applying said modulating signal to said selected gate through said selector.

12. The device according to claim 10 whereby said means for applying a modulating signal to said gate includes two modulating signal generators, means for connecting one signal generator to said row selector and the other signal generator to said column selector and means for applying said modulating signals through said selectors to the conductive gate.

References Cited

UNITED STATES PATENTS

| | | | |
|---|---|---|---|
| 2,732,469 | 1/1956 | Palmer | 178—6 XR |
| 2,899,488 | 8/1959 | Kalfaian | 178—5.4 |
| 2,919,574 | 1/1960 | Fotland | 73—67.6 |
| 3,325,777 | 6/1967 | Fyler | 340—3 |

ROBERT L. GRIFFIN, Primary Examiner

ROBERT L. RICHARDSON, Assistant Examiner

U.S. Cl. X.R.

73—69; 250—211; 340—5